United States Patent [19]

Masenas, Jr.

[11] Patent Number: 4,555,776

[45] Date of Patent: Nov. 26, 1985

[54] VOLTAGE BALANCING CIRCUIT FOR MEMORY SYSTEMS

[75] Inventor: Charles J. Masenas, Jr., Jericho, Vt.

[73] Assignee: International Business Machines Corporation, Armonk, N.Y.

[21] Appl. No.: 369,970

[22] Filed: Apr. 19, 1982

[51] Int. Cl.$^4$ .............................................. G11C 7/00
[52] U.S. Cl. ................................. 365/202; 365/154; 365/179
[58] Field of Search ............... 365/154, 155, 179, 190, 365/203, 174, 202; 307/264, 299 A

[56] References Cited

U.S. PATENT DOCUMENTS

| | | | |
|---|---|---|---|
| 3,786,442 | 1/1974 | Alexander et al. | 340/173 R |
| 3,949,383 | 4/1976 | Askin et al. | 340/173 DR |
| 4,090,255 | 5/1978 | Berger et al. | 365/154 |
| 4,125,878 | 11/1978 | Watanabe | 365/202 |
| 4,158,237 | 6/1979 | Wiedmann | 365/154 |
| 4,272,834 | 6/1981 | Noguchi et al. | 365/230 |
| 4,280,198 | 7/1981 | Heuber et al. | 365/203 |
| 4,302,823 | 11/1981 | Gersbach et al. | 365/190 |
| 4,404,662 | 9/1983 | Masenas, Jr. | 365/154 |

OTHER PUBLICATIONS

Proceedings of IEE-vol. 120, No. 10, Oct. 1973, pp. 1212-1215.

Primary Examiner—James W. Moffitt
Attorney, Agent, or Firm—Stephen J. Limanek

[57] ABSTRACT

A voltage balancing circuit, particularly suitable for bipolar memory arrays producing small signals, is provided which includes first and second conductive lines, a point of reference potential, a first device disposed between the first conductive line and the point of reference potential, a second device disposed between the second conductive line and the point of reference potential, first and second transistors, first means for coupling the first line through the first transistor to the second line, second means for coupling the second line through the second transistor to the first line, and means for supplying substantially equal signals to the control electrodes of the first and second transistors. When used in a memory array, the conductive lines are the bit/sense lines, the point of reference potential is a bit/sense line reference voltage and the equal signals for the control electrodes of the transistors are provided in response to a signal from a bit decoder.

23 Claims, 2 Drawing Figures

VOLTAGE BALANCING CIRCUIT FOR MEMORY SYSTEMS

TECHNICAL FIELD

This invention relates to a voltage balancing circuit which is particularly useful in semiconductor memory systems employing a pair of bit/sense lines for a column of cells producing small signals, such as the cells of a merged transistor logic (MTL) or integrated injection logic (I$^2$L) memory array.

BACKGROUND ART

MTL or I$^2$L memory cells are now well known. For example, in commonly assigned U.S. Pat. No. 4,158,237, filed on July 13, 1978, by S. K. Wiedmann, there is disclosed an MTL or I$^2$L cell which includes a flip-flop circuit having two cross-coupled bipolar switching transistors with a pair of load or injector elements, one of which is connected to the base of one of the cross-coupled transistors and to the collector of the other cross-coupled transistor and the other load or injector element is connected to the base of the other cross-coupled transistor and to the collector of the one cross-coupled transistor. The cell is controlled or accessed via a single word line connected to the cross-coupled transistors through both load or injector elements and first and second bit/sense lines, with the first bit/sense line being connected to the emitter of the one cross-coupled transistor and the second bit/sense line being connected to the emitter of the other cross-coupled transistor. The cross-coupled transistors are NPN transistors and the load or injector elements are PNP transistors.

To reduce access time in arrays employing the MTL type cells, it is known to discharge the bit/sense line capacitance before selection in order to reduce the differential voltage developed between a given pair of bit/sense lines, which voltage is dependent on the state of the cells connected to the given bit/sense line pair. Individual bit line transistor means coupled to each bit line for reducing the access time is taught in commonly assigned U.S. Pat. No. 4,280,198, filed by K. Heuber and S. K. Wiedmann on Dec. 7, 1979. Other bipolar circuits which have been used to balance the differential voltage between a pair of bit/sense lines are disclosed in commonly assigned U.S. Pat. No. 4,090,255, filed by H. H. Berger, K. Heuber, W. Klein, K. Najmann and S. Wiedmann on Mar. 1, 1976, and U.S. Pat. No. 4,302,823, filed by J. E. Gersbach and I. W. Kim on Dec. 27, 1979, and in U.S. Pat. No. 3,786,442, filed by S. B. Alexander, R. W. Bryant, R. J. Lipp and G. K. Tu on Feb. 24, 1972. Field effect transistor circuits, as described, e.g., in commonly assigned U.S. Pat. No. 3,949,383, filed by H. O. Askin, E. C. Jacobson, J. M. Lee and G. Sonoda on Dec. 23, 1974, and in U.S. Pat. No. 4,272,834, filed by Y. Noguchi and T. Ito on Oct. 3, 1979, have also been used to balance the differential voltage developed between a pair of bit/sense lines coupled to a column of field effect transistor memory cells.

DISCLOSURE OF THE INVENTION

It is an object of this invention to provide an improved voltage balancing bipolar circuit between a pair of conductive lines which reduces the offset voltage of either positive or negative polarity to a minimum voltage in a shorter period of time than by known bipolar circuits, particularly when used for reducing the access time in a memory array developing small signals.

In accordance with the teachings of this invention, a voltage balancing circuit, particularly suitable for memory arrays, is provided which includes first and second conductive lines, a point of reference potential, a first device disposed between the first conductive line and the point of reference potential, a second device disposed between the second conductive line and the point of reference potential, first and second transistors, first means for coupling the first line through the first transistor to the second line, second means for coupling the second line through the second transistor to the first line, and means for supplying substantially equal signals to the control electrodes of the first and second transistors. When used in a memory array, the conductive lines are the bit/sense lines, the point of reference potential is a bit/sense line reference voltage and the equal signals for the control electrodes of the transistors are provided in response to a signal from a bit decoder.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
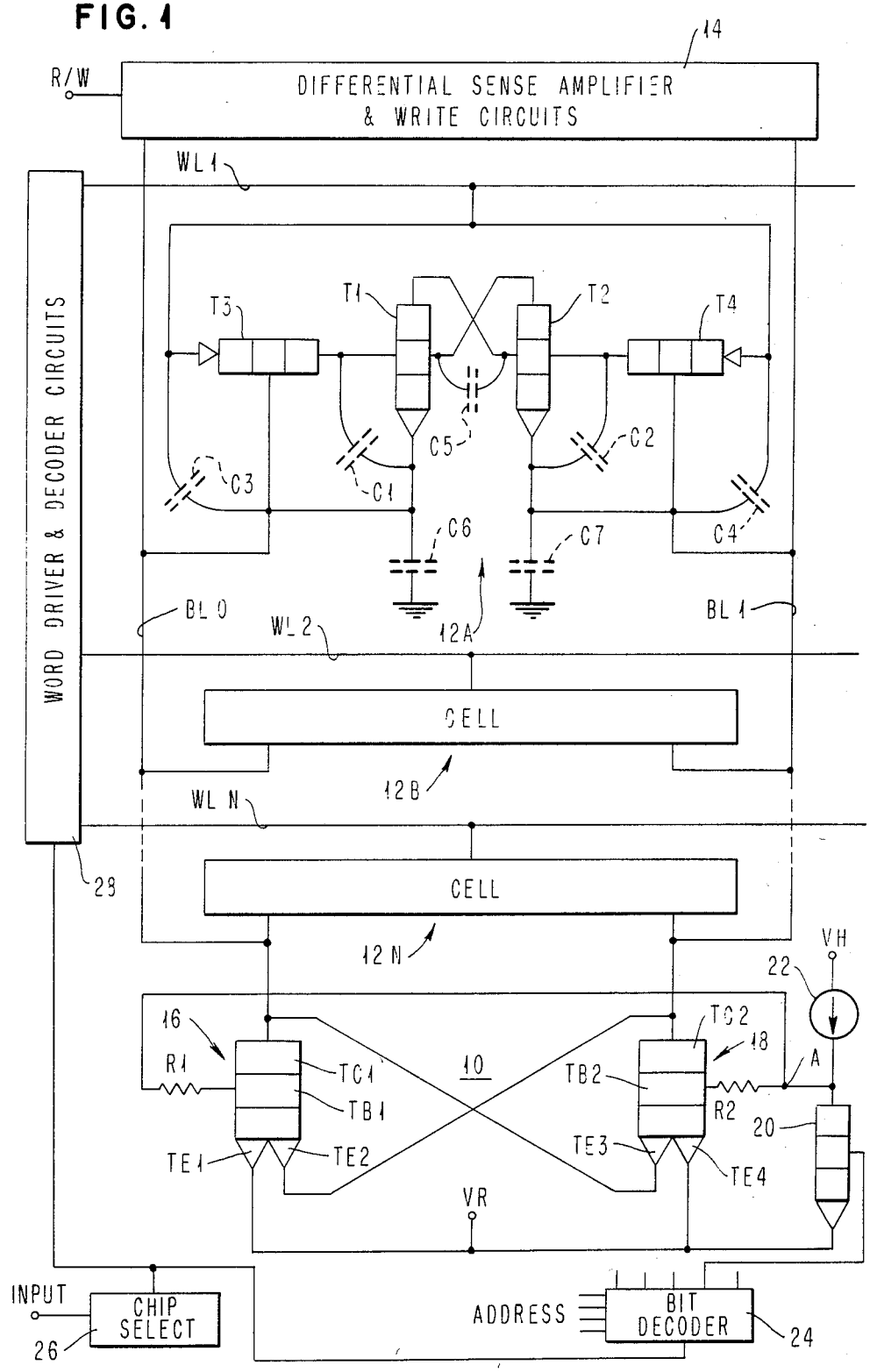
FIG. 1 shows the voltage balancing circuit of the present invention in a bipolar memory system.

Referring to FIG. 1 of the drawings in more detail, there is illustrated a memory system with the voltage balancing circuit 10 of the present invention. The system includes first and second bit/sense lines BL1 and BL0 to which is connected a plurality of MTL cells 12A, 12B and 12N, e.g., a total of 128 cells.

As indicated in FIG. 1 of the drawings, cell 12A includes first and second cross-coupled inverting NPN transistors T1 and T2, respectively, and first and second load or injector transistors T3 and T4, of the PNP type. The base-emitter capacitances of transistors T1, T2, T3 and T4 are indicated by capacitors C1, C2 and C3 and C4, respectively, as parasitic capacitors. The base-collector capacitance of transistors T1 and T2 is indicated by capacitor C5. The PNP transistor T3 has its collector connected to the base of the NPN transistor T1 and the PNP transistor T4 has its collector connected to the base of the NPN transistor T2, with the base of the transistor T3 being connected to the emitter of the transistor T1 and the base of the transistor T4 being connected to the emitter of the transistor T2. As is known, e.g., in the hereinabove referenced Wiedmann patent, a first common region in a semiconductor substrate forms the collector of the transistor T3 and the base of the transistor T1, a second common region forms the base of the transistor T3 and the emitter of the transistor T1, a third common region forms the collector of the transistor T4 and the base of the transistor T2 and a fourth common region forms the base of the transistor T4 and the emitter of the transistor T2.

The bit/sense line BL0 is connected to the emitter of the transistor T1 and the bit/sense line BL1 is connected to the emitter of the transistor T2. Substrate isolation or bit/sense line capacitances are indicated at capacitors C6 and C7, with capacitor C6 being connected to the emitter of the transistor T1 and capacitor C7 being connected to the emitter of the transistor T2. The capacitors C6 and C7 are tied to ground or to the semiconductor substrate, which is at the most negative potential of the system. Cells 12B and 12N are similar to cell 12A, although indicated only in block form.

A first word line WL1 is connected to the emitters of the PNP transistors T3 and T4 of the cell 12A, and a second word line WL2 and a third word line WLN are similarly connected to the cells 12B and 12N, respectively.

Differential sense amplifier and write circuits 14, having a read/write input terminal R/W, of a known type, are connected to the first and second bit/sense lines BL0 and BL1. Also connected to the first and second bit/sense lines BL0 and BL1 is the voltage balancing circuit 10.

The voltage balancing circuit 10 includes a first bipolar transistor 16, of the NPN type, having a collector TC1, a base TB1 and first and second emitters TE1 and TE2, respectively, and a second bipolar transistor 18, also of the NPN type, having a collector TC2, a base TB2 and first and second emitters TE3 and TE4, respectively. The first bit/sense line BL0 is connected to the collector TC1 of the first transistor 16 and the second bit/sense line BL1 is connected to the collector TC2 of the second transistor 18. The emitters TE1 and TE4 of the transistors 16 and 18, respectively, are connected to a bit/sense line reference voltage terminal VR to which a voltage of +1.6 volts may be applied. The second emitter TE2 of the first transistor 16 is connected to the second bit/sense line BL1 and the first emitter TE3 of the second transistor 18 is connected to the first bit/sense line BL0.

A control transistor 20 has its collector connected to the base TB1 of the first transistor 16 through a first resistor R1 and to the base TB2 of the second transistor 18 through a second resistor R2. The resistors R1 and R2 are arranged as current splitting resistors, at node A, having a resistance magnitude large enough, e.g., 3000 ohms each, so that they share equal current and are yet small enough so that when the voltage at the collector of the control transistor 20 or node A is lowered rapidly, the first and second transistors 16 and 18 are turned off simultaneously. The emitter of the control transistor 20 is connected to the bit/sense line reference voltage terminal VR and the collector of the control transistor 20 is also connected to a power supply terminal VH, to which +5 volts are applied, through a standby current source 22. The base of the control transistor 20 is connected to one of a plurality of outputs from a bit decoder 24 having well known address inputs. A chip select circuit 26 has its output connected to the bit decoder 24 and to word driver and decoder circuits 28 which selectively apply pulses to the word lines WL1, WL2 and WLN.

Figure 2:
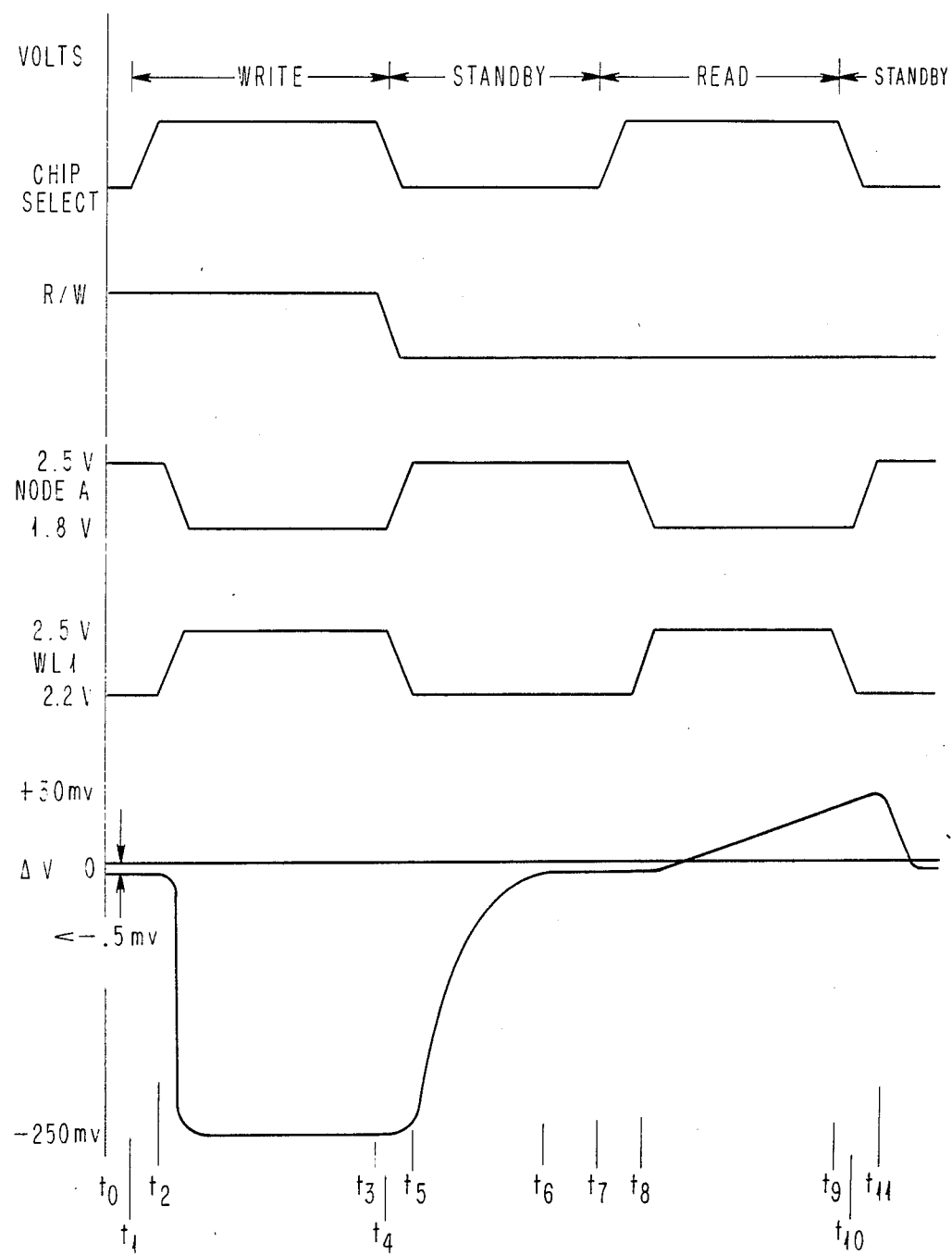
FIG. 2 is a pulse program which may be used to operate the system of FIG. 1 of the drawings.

To better understand the operation of the system illustrated in FIG. 1 of the drawings, reference may be had to the pulse program indicated in FIG. 2 of the drawings. At time $t_0$ the system is in standby with the differential voltage $\Delta V$ between the bit/sense lines BL1 and BL0, i.e., the voltage $V_{BL1}$ on the first bit/sense line BL1 minus the voltage $V_{BL0}$ on the second bit/sense line BL0, being equal to less than $-0.5$ millivolts. At this time, it may be assumed that all 128 cells 12A to 12N are storing a 0 binary digit. During standby, the voltage on word line WL1 is down at 2.2 volts, the voltage at node A is up at 2.5 volts and the voltage at the output of the chip select is down, with the voltage at the read/write terminal R/W being either up or down.

To write a 1 binary digit of information into a cell, e.g., cell 12A, the read/write pulse R/W is high and the chip select voltage goes up at time $t_1$, producing an up voltage at the base of the control transistor 20 from the bit decoder 24. At time $t_2$ the voltage at node A decreases and goes to a value of 1.8 volts turning off the first and second transistors 16 and 18, with the voltage on the word line WL1 increasing from 2.2 volts to 2.5 volts. With the voltages on the terminal R/W and the first word line high, the voltage differential $\Delta V$ between the first and second bit/sense lines BL0 and BL1 increases to about $-250$ millivolts causing the cell 12A to switch from storing a 0 binary digit to storing a 1 binary digit, with all other cells being uninterrupted. At time $t_3$ after the 1 binary digit has been stored in the cell 12A, the chip select voltage is turned off and at time $t_4$ the voltage on node A begins to rise, while the voltage on the word line WL1 begins to fall to 2.2 volts. At time $t_5$ when node A is at 2.5 volts and the first and second transistors 16 and 18 are turned on the high voltage on the first bit/sense line BL0 begins to discharge through the second emitter TE2 of the first transistor 16 to the second bit/sense line BL1, while simultaneously charge from the first bit/sense line BL0 is being dissipated through the first emitter TE3 of the second transistor 18. At time $t_6$, which is only about 20 nanoseconds after time $t_5$, the differential voltage $\Delta V$ between the first and second bit/sense lines BL0 and BL1 has been reduced to approximately $-0.5$ millivolts. This recovery time is three to four times faster than the recovery in the prior art bipolar voltage balancing circuits.

Shortly after this recovery period, at time $t_7$, a read portion of the access cycle may begin for reading out the data stored in the cells 12A by producing an up voltage at the output of the chip select 26. At time $t_8$ the voltage on word line WL1 goes up and the voltage at node A goes down, turning off first and second transistors 16 and 18. With transistors 16 and 18 off and the voltage at read/write terminal R/W low, the differential voltage $\Delta V$ between the first and second bit/sense lines BL0 and BL1 begins to increase in a positive direction attaining a voltage as high as +50 millivolts which is detected as a 1 digit of binary information by the differential sense amplifier circuits 14 at time $t_9$ or sooner. After the data has been read, at time $t_9$ the voltage at the output of the chip select 26 decreases, causing the voltage at node A to begin to increase at time $t_{10}$ turning on first and second transistors 16 and 18. With transistors 16 and 18 turned on and the voltage on the word line WL1 now at a down level, the higher voltage on the second bit/sense line BL1 begins to discharge through the first emitter TE3 of the second transistor 18 to the first bit/sense line BL0, while simultaneously charge from the second bit/sense line BL1 is being dissipated through the second emitter TE2 of the first transistor 16. At time $t_{11}$, which is substantially less than 20 nanoseconds from the time $t_{10}$, the differential voltage $\Delta V$ between the first and second bit/sense lines BL0 and BL1 has been reduced again to approximately $-0.5$ millivolts.

It should be noted that a worst case situation has been described with 127 cells connected to bit/sense lines BL0 and BL1 storing a first binary digit and only one cell storing the other binary digit. It can be seen that if approximately one half of the cells stored a first binary digit and the other half of the cells stored the other binary digit there would be little if any voltage imbalance between the bit/sense lines BL0 and BL1 and, therefore, recovery would be even more rapid. It should be understood that the voltage balancing circuit of this invention is particularly useful for balancing any pair of lines when very small voltages or signals of the order of a few millivolts are to be detected, regardless of the source of the small signals.

Although the system has been described with the assumption that all 0 digits of binary information were stored in the 128 cells 12A to 12N at time $t_0$, it should be understood that the system is equally effective when all 1 digits of binary information are stored in the 128 cells 12A to 12N at time $t_0$ and subsequent thereto a 0 digit is written into the cell 12A and then read out.

The first and second transistors 16 and 18 have been illustrated and described as being transistors having multiple emitters TE1 and TE2, and TE3 and TE4, respectfully. However, if desired, two separate NPN transistors may be used in place of the first transistor 16, with one of the transistors being connected between the first bit/sense line BL0 and the bit line reference voltage terminal VR and the other transistor being connected between the first and second bit/sense lines BL0 and BL1, and two separate NPN transistors may be used in place of the second transistor 18, with one of the transistors being connected between the second bit/sense line BL1 and the bit line reference voltage terminal VR and the other transistor being connected between the first and second bit/sense lines BL0 and BL1, in a similar manner to the connections made to transistors 16 and 18. However, the multi-emitter transistors 16 and 18 in FIG. 1 are preferred since they can be arranged in a very dense layout.

It can be seen that in accordance with the teachings of this invention a voltage balancing bipolar circuit of particular use in a memory system has been provided which reduces the direct current offset voltage of either positive or negative polarity between a pair of conductive lines, which may be caused by a current flow ratio of approximately 10 to 1, to less than 0.5 millivolts from approximately 250 millivolts, within a recovery or restore time of approximately 20 nanoseconds, whereas in the prior art more than 60 seconds was required for such a recovery.

It should also be noted that although a memory array having only one pair of bit/sense lines has been illustrated for purposes of clarity, it should be understood that the array may include many pairs of bit/sense lines, e.g., 128 pairs, with each word line connected to 128 cells.

While the invention has been particularly shown shown and described with reference to preferred embodiments thereof, it will be understood by those skilled in the art that various changes in form and detail may be made therein without departing from the spirit and scope of the invention.

What is claimed is:

1. A voltage balance circuit comprising
first and second conductive lines,
a point of reference potential,
first and second transistors, said first transistor being disposed between said first conductive line and said point of reference potential and said second transistor being disposed between said second conductive line and said point of reference potential,
means for coupling said first conductive line through said first transistor to said second conductive line,
means for coupling said second conductive line through said second transistor to said first conductive line,
means for applying simultaneously signals of unequal magnitude to a current carrying electrode of said first and second transistors through said first and second conductive lines during a given period of time, and
means for applying simultaneously substantially equal signals to the control electrodes of said transistors during said given period of time.

2. A voltage balancing circuit comprising
first and second conductive lines,
means for applying simultaneously signals of unequal magnitude to said first and second conductive lines during a given period of time,
a point of reference potential,
first and second transistors, each having first and second emitters, said first transistor being disposed between said first conductive line and said point of reference potential and said second transistor being disposed between said second conductive line and said point of reference potential with said first emitter of each of said transistors being connected to said point of reference potential,
means for coupling said first conductive line through said first transistor at the second emitter thereof to said second conductive line,
means for coupling said second conductive line through said second transistor at the second emitter thereof to said first conductive line, and
means for applying simultaneously substantially equal signals to the control electrodes of said transistors during said given period of time.

3. A voltage balancing circuit as set forth in claim 2 wherein said transistors are of the NPN type.

4. A voltage balancing circuit as set forth in claim 2 wherein said equal signal applying means includes first and second resistors and a current source connected to the control electrode of said first transistor through said first resistor and to the control electrode of said second transistor through said second resistor.

5. A voltage balancing circuit as set forth in claim 4 wherein said first resistor has a resistance magnitude substantially equal to that of said second resistor.

6. A voltage balancing circuit as set forth in claim 4 wherein each of said first and second transistors includes a collector electrode and first and second emitters, said first conductive line being connected to said point of reference potential through the collector electrode and first emitter of said first transistor and said second conductive line being connected to said point of reference potential through the collector electrode and first emitter of said second transistor, said first conductive line coupling means being connected through the second emitter of said first transistor to said second conductive line and said second conductive line coupling means being connected through the second emitter of said second transistor to said first conductive line.

7. A voltage balancing circuit comprising
first and second conductive lines,
means for applying simultaneously signals of unequal magnitude to said first and second conductive lines during a given period of time,
a point of reference potential, first and second transistors, each having first and second emitters, said first transistor being disposed between said first conductive line and said point of reference potential and said second transistor being disposed between said second conductive line and said point of reference potential, the first emitter of each of said transistors being connected to said point of reference potential, means for coupling said first conductive line through the second emitter of said first transistor to said second conductive line, means for coupling said second conductive line through the second emitter of said second transistor to said first conductive line, and means for supplying simultaneously substantially equal currents to the control electrodes of said transistors during said given period of time.

8. A voltage balancing circuit as set forth in claim 7 wherein said transistors are of the NPN type.

9. A voltage balancing circuit as set forth in claim 8 wherein said current supplying means includes first and second resistors and a current source connected to the control electrode of said first transistor through said first resistor and to the control electrode of said second transistor through said second resistor.

10. A voltage balancing circuit comprising
first and second conductive lines,
a point of reference potential,
first and second transistors, said first transistor being connected between said first and second conductive lines in a given polarity and said second transistor being connected between said first and second conductive lines in an opposite polarity to that of said given polarity,
first and second devices,
means for coupling said first conductive line through said first device to said point of reference potential,
means for coupling said second conductive line through said second device to said point of reference potential,
means for applying simultaneously signals of unequal magnitude to a current carrying electrode of said first and second transistors through said first and second conductive lines during a given period of time, and
means for applying simultaneously substantially equal signals to the control electrodes of said transistors during said given period of time.

11. A voltage balancing circuit comprising
first and second conductive lines,
means for applying simultaneously signals of unequal magnitude to said first and second conductive lines during a given period of time,
a point of reference potential,
first and second transistors, each having an emitter and a collector, the emitter of said first transistor and the collector of said second transistor being connected to said first conductive line and the emitter of said second transistor and the collector of said first transistor being connected to said second conductive line, said first transistor being connected between said first and second conductive lines in a given polarity and said second transistor being connected between said first and second conductive lines in an opposite polarity to that of said given polarity,
first and second devices, means for coupling said first conductive line through said first device to said point of reference potential, means for coupling said second conductive line through said second device to said point of reference potential, and means for applying simultaneously substantially equal signals to the control electrodes of said transistors during said given period of time.

12. A voltage balancing circuit as set forth in claim 11 wherein said transistors are of the NPN type.

13. A voltage balancing circuit comprising
first and second conductive lines,
means for applying simultaneously signals of unequal magnitude to said first and second conductive lines during given period of time,
means for applying a voltage to each of said conductive lines,
first and second devices, said first device being disposed between said voltage applying means and said first conductive line and said second device being disposed between said voltage applying means and said second conductive line,
a third device having a control electrode arranged to pass current from a first end to a second end,
a fourth device having a control electrode arranged to pass current from a first end to a second end, the first end of said third device and the second end of said fourth device being connected to said first conductive line and the first end of said fourth device and the second end of said third device being connected to said second conductive line, and
means coupled to the control electrodes of said third and fourth devices for simultaneously turning on said third and fourth devices during said given period of time.

14. A voltage balancing circuit as set forth in claim 13 wherein said third and fourth devices are NPN type transistors.

15. A voltage balancing circuit as set forth in claim 14 wherein said first and second devices are NPN type transistors having control electrodes connected to said turning on means.

16. A memory system comprising
first and second bit/sense lines,
a plurality of charge storage cells connected to said bit/sense lines,
means for applying a voltage to each of said bit/sense lines,
first and second devices, said first device being connected between said first bit/sense line and said voltage applying means and said second device being connected between said second bit/sense line and said voltage applying means,
third and fourth devices each having a control electrode arranged to pass current from a first end to a second end, the first end of said third device and the second end of said fourth device being coupled to said first bit/sense line and the second end of said third device and the first end of said fourth device being coupled to said second bit/sense line,
first means for applying simultaneously signals of unequal magnitude from said storage cells to said first and second bit/sense lines during a given period of time, and
second means for applying simultaneously control signals of substantially equal magnitude to the control electrodes of said third and fourth devices during said given period of time.

17. A memory system as set forth in claim 16 wherein said third and fourth devices are NPN type transistors and said storage cells are of the merged transistor logic (MTL) type.

18. A memory system as set forth in claim 17 wherein said first and second devices are NPN type transistors.

19. A memory system as set forth in claim 18 wherein said second means includes first and second resistors and a current source connected to the control electrode of said third device through said first resistor and to the control electrode of said fourth device through said second resistor.

20. A memory system as set forth in claim 19 wherein said first means includes a word driver circuit and said second means further includes a control transistor connected between said current source and said voltage applying means and a bit decoder having an output connected to the control electrode of said control transistor, and further including a chip select circuit having an output connected to said word driver circuit and to said bit decoder.

21. A memory system as set forth in claim 20 further including differential sense amplifier and write circuits coupled to said first and second bit/sense lines and means for controlling said amplifier and write circuits.

22. A voltage balancing circuit comprising
first and second conductive lines,
a point of reference potential,
first and second transistors, said first transistor being disposed between said first conductive line and said point of refference potential and said second transistor being disposed between said second conductive line and said point of reference potential,
means for coupling said first conductive line through said first transistor to said second conductive line,
means for coupling said second conductive line through said second transistor to said first conductive line, and
means including first and second resistors, a current source connected to the control electrode of said first transistor through said first resistor and to the control electrode of said second transistor through said second resistor, said first resistor having a resistance magnitude substantially equal to that of said second resistor, and a third transistor connected between said current source and said point of reference potential for applying simultaneously substantially equal signals to the control electrodes of said first and second transistors.

23. A voltage balancing circuit as set forth in clam 22 wherein said third transistor is of the NPN type having a collector connected to said current source, an emitter connected to said point of reference potential and a base connected to a control voltage terminal.

* * * * *